United States Patent
Gong et al.

(10) Patent No.: US 9,852,617 B2
(45) Date of Patent: Dec. 26, 2017

(54) INVERTER DEVICE

(71) Applicant: New Focus Lighting & Power Technology (Shanghai) Co., Ltd, Shanghai (CN)

(72) Inventors: Shiquan Gong, Shanghai (CN); Jianxing Zhang, Shanghai (CN)

(73) Assignee: NEW FOCUS LIGHTING & POWER TECHNOLOGY (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 14/917,654

(22) PCT Filed: Nov. 13, 2014

(86) PCT No.: PCT/CN2014/090986
§ 371 (c)(1),
(2) Date: Mar. 9, 2016

(87) PCT Pub. No.: WO2016/074189
PCT Pub. Date: May 19, 2016

(65) Prior Publication Data
US 2016/0300482 A1     Oct. 13, 2016

(30) Foreign Application Priority Data
Nov. 10, 2014 (CN) .......................... 2014 1 0629218

(51) Int. Cl.
*H02J 3/40* (2006.01)
*G08C 19/00* (2006.01)
(Continued)

(52) U.S. Cl.
CPC .............. *G08C 19/00* (2013.01); *H02M 7/44* (2013.01); *H05K 7/20909* (2013.01); *H04M 2201/22* (2013.01)

(58) Field of Classification Search
None
See application file for complete search history.

(56) References Cited

U.S. PATENT DOCUMENTS 7,761,509 B2 *   7/2010   Matsuda ............. H04L 12/2818
                                                          379/102.03
9,241,237 B2 *   1/2016   Hirsch .................... H04L 63/18
(Continued)

*Primary Examiner* — K. Wong
(74) *Attorney, Agent, or Firm* — Fish IP Law, LLC

(57) ABSTRACT

The present invention relates to an inverter device. Regard to the problem in the traditional convert device that the user is difficult to obtain the information shown on the display panel in time; the state of the inverter can not be switched remotely after the user leaves; discharging or early switching-off caused by missing battery information; and the draught fan can only be at the state of 'full-speed-start' or switch-off, the invention provides an inverter device, it is configured with an extensible flexible wire to fix the display panel of the inverter to the place the user wants to for getting the information of the inverter in time; by virtue of wireless transmission, user can control the state of the inverter remotely; by adding a test module to the inverter device, it avoids the waste of electricity which is caused by the discharging of the battery-to-convert and switching off.

9 Claims, 1 Drawing Sheet

(51) Int. Cl.
  *H02M 7/44* (2006.01)
  *H05K 7/20* (2006.01)

(56) References Cited

U.S. PATENT DOCUMENTS

| | | | |
|---|---|---|---|
| 9,294,800 B2 * | 3/2016 | McMahon | G06F 21/445 |
| 9,460,575 B2 * | 10/2016 | Park | G07C 9/00134 |
| 9,516,503 B2 * | 12/2016 | Berns | H04W 12/08 |
| 2014/0169795 A1 * | 6/2014 | Clough | G06F 19/3418 |
| | | | 398/106 |
| 2015/0339917 A1 * | 11/2015 | Messing | G08C 17/02 |
| | | | 340/12.5 |

* cited by examiner

INVERTER DEVICE

This application is a U.S. National Phase of PCT/CN2014/090986, filed Nov. 13, 2014, which claims the benefit of priority to Chinese Patent Application No. CN 201410629218.3, filed on Nov. 10, 2014, the entire content of which is incorporated herein by reference.

FIELD OF THE INVENTION

The present invention relates to the technical field of electronic equipment, specifically, to an inverter device.

BACKGROUND

With the development of electronic equipment, the requirements for inverters are getting higher. Now, it has realized high frequency of inverter, and in the mean time, there are higher requirements for the convenience in operation and for the test function. At present, remote control inverters with wire are widespread in the market, such inverters control on-off state by using remote control, and it brings convenience to people.

However, such inverters are mostly fixed at a corner, and it is configured with wire, so that it is convenient for users to switch the inverters on or off, but even the user can control the on-off state via remote control wire, it is still impossible to obtain the operating state shown on the display panel in time; especially when the inverter is configured at the place which is difficult to observe and to wirelessly communicate (for example, when it is too far to transmit and receive, or the receiving has been blocked etc.), the function of status display and wireless transmission of the inverter may be failure. At the same time, in the process of using inverter, draught fan is in a solely 'on'-state. The noise of the draught fan is relatively big, and in process of using the inverter, the draught fan can not be switched off individually. The inverter does not have the timing function, the on-off state of the inverter must be set by the user before they leave, and the state of the inverter can not be switched remotely after the user leaves. For now, the inverter is just a voltage conversion device. It is not possible for the user to know the state of the battery, and it hasn't the function of setting, which is easy to cause an early switching-off when the battery is still with electricity, or discharging even if the battery is out of electricity, i.e. over discharging. Besides, the main parts of power supply of the inverter are battery and electric generator, and user is not able to get to know the state of battery and electric generator.

Therefore, it is a challenge for the skilled in the art to create an inverter which is easy to use and with the test function.

SUMMARY OF THE INVENTION

Regard to the problems mentioned above, this invention provides an inverter device, which draws out the wireless communication device and the display panel of the inverter via a flexible cable, in order to solve the problem that, when the inverter is configured at the place which is difficult to observe and wirelessly communicate (for example, when it is too far to transmit and receive, or the receiving has been blocked etc.), the function of status display and the wireless transmission of the inverter may be failure.

To achieve the mentioned aim, the details are described as follow:

An inverter device, comprising a main body, also comprising:
a wireless communication device, connected to the main body via a flexible wire;
wherein, the wireless communication device and the main body are independent devices to each other, so that the wireless communication device can easily transmit and receive message.

In the above device, the wireless communication device is also integrated with a display panel; and
the display panel is connected to the main body via the flexible wire, and is configured to display state information of the main body.

In the above device, further comprising:
a test module, configured to test capacity, starting current and starting ability of a power source to be converted.

In the above device, further comprising:
a draught fan, configured to cool the inverter device;
a draught fan controller, connected to the draught fan, configured to control operations of the draught fan.

In the above device, the wireless communication device receives and transmits data signal via Bluetooth, Wifi or 2.4G network.

In the above device, a mobile control terminal communicates with the wireless communication device via Bluetooth, Wifi or 2.4G network for data signal transmitting and receiving of the wireless communication device.

In the above device, the mobile control terminal is a mobile phone or a tablet computer.

In the above device, the mobile control terminal controls the main body via the wireless communication device.

In the above device, the main body is configured with a control unit, and the wireless communication device controls the main body via the control unit.

In the above device, the main body is further configured with a groove which is configured to place the wireless communication device.

The advantages and beneficial effects of the invention are as follow:

Regard to the problems that the inverter is placed at a consistent corner, which makes the user difficult to obtain the information shown on the display panel in time; the state of the inverter can not be switched remotely after the user leaves; discharging or early switching-off (even when the battery is still with electricity) may be caused by the traditional inverter; the draught fan can only be at the state of 'full-speed-start' or switch-off, the invention provides an inverter device, which enables users to place the wireless communication device, which is integrated with a display panel, wherever they need, by configuring a extensible flexible wire, for ease of the receiving and transmitting of the wireless communication device; at the same time, users can obtain the information of the inverter in time; by adding a test module to the inverter device, it avoids the waste of electricity which is caused by the discharging of the battery-to-convert and switching off (even when the battery is still with electricity); enable the draught fan to be in a state of variable speed, which reduces the noise, and enlarges the service life of the inverter device.

BRIEF DESCRIPTIONS OF THE DRAWINGS

The accompanying drawings, together with the specification, illustrate exemplary embodiments of the present disclosure, and, together with the description, serve to explain the principles of the present invention.

DETAILED DESCRIPTION

It is further described the technical solution of the invention with the accompanying drawings below, and it does not intend to limit the invention.

Regarding to the problems mentioned above, the invention provides an inverter device, which integrates the display panel and wireless communication device into one individual module, i.e., state-display and wireless receiving module, and extends the individual module via a flexible wire, which solve the problems that it is inconvenience for the user to obtain the state information and it is impossible for the user to control the state of the inverter remotely; the inverter device is also configured with a test module, which solves the problem of discharging and waste of the battery efficiently due to the fact that the user is unable to know if the battery is good or bad. Furthermore, PWM (Pulse Width Modulation) is used to control the draught fan controller, which is already configured on the main body of the inverter, it achieve the purpose of controlling the rotate speed of the draught fan, which controls the rotate speed and the noise and enlarge the service life of the draught fan efficiently.

Figure 1:
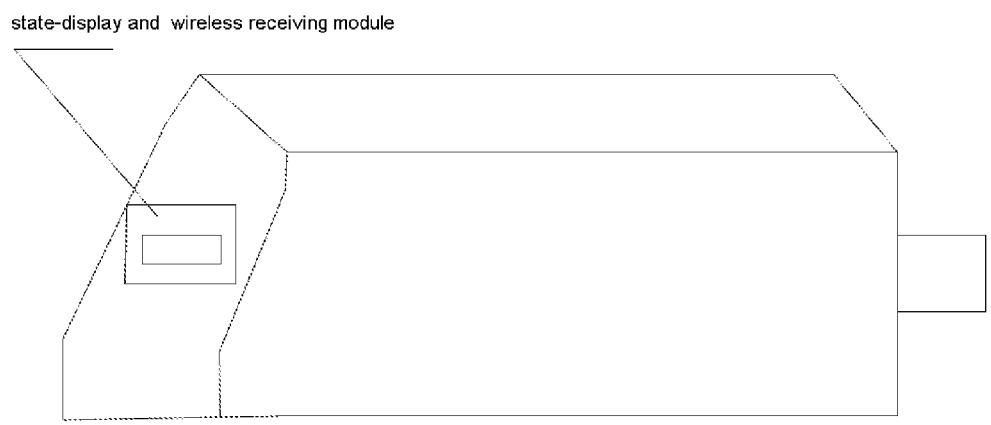
FIG. 1 is a structure diagram of an inverter device in prior art of the present invention.

FIG. 1 is a structure diagram of an inverter device in prior art. For the convenience of use for the users, it is already configured with a remote control wire. When the inverter device is placed at a corner, users can use a remote control to control the on-off state of the inverter efficiently within a limited distance range. The distance range should meet the requirements of a preset distance; if the distance is too large, the inverter will be out of the control range of the remote control, and the user will be unable to control the on-off state of the inverter efficiently. Meanwhile, the field of view for finding the inverter needs to meet a preparatory condition. Otherwise, blocking of the remote control may cause the failure of state display or the failure of wireless transmission.

Figure 2:
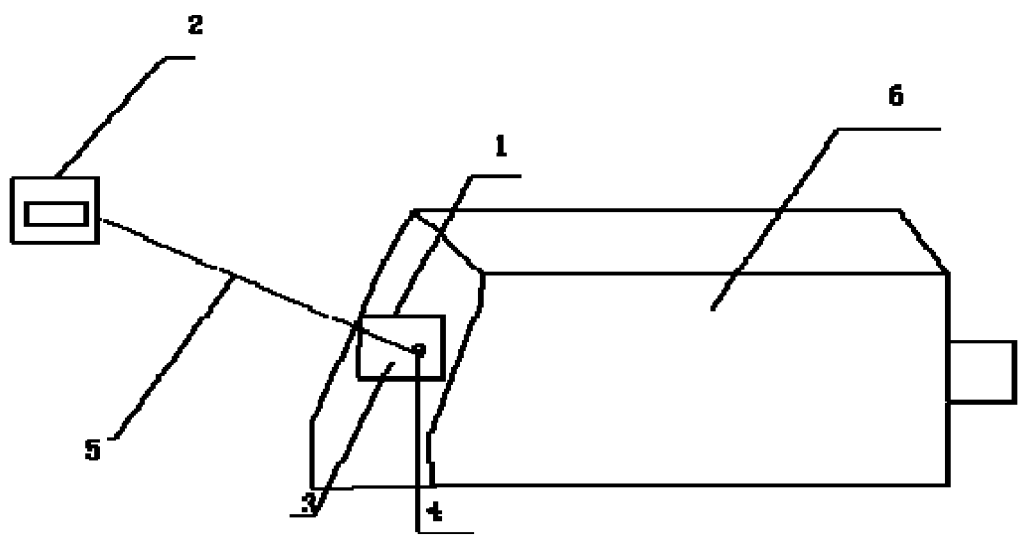
FIG. 2 is a structure diagram of an inverter device in an embodiment of the present invention.

FIG. 2 is a structure diagram of an inverter device of an embodiment of the invention. As shown in FIG. 1, there is a groove 1 configured on the inverter, an integrated module 2 which includes a wireless communication device and a display panel configured on the wireless communication device. The configuration of the groove 1 must obey a preparatory condition, that the groove 1 can fit the integrated module 2 exactly, and the groove 1 should not be too big so that the elements of state-display and wireless receiving module would not fall into the groove 1; at the same time, the groove 1 should not be too small so that the integrated module 2 can not be placed inside the groove 1 when the user intends to do so. A control unit is configured on the main body of the inverter. A mobile control terminal transmits an control command to the wireless communication device; then the wireless communication device call the control unit and accomplish the operation of the inverter; then, the command returns to the mobile control terminal; and the switch of the main body of the inverter has also been dragged out and is integrated at the integrated module 2 so that the user can control the on-off of the inverter easily.

A groove base 3 is configured at the bottom of the groove. A through-hole 4 is configured on the panel, and is configured to provide routes for the flexible wire 5. Therefore, the through-hole 4 needs to meet a certain preparatory condition, such as, the diameter of the through-hole should be slightly larger than the diameter of the flexible wire so that the flexible wire can be drag out and in smoothly. At the bottom of the groove base 3 (which is not shown in the Figure), it is configured with a binding post and spare space. The binding post is configured to be connected to an end of the flexible wire 5, of which the other end is connected to the integrated module 2, for achieving the electric connection between the display panel and the main body of the inverter 6. The spare space configured at the bottom of the groove base 3 is configured to store the flexible wire which is not in use, so that the panel can be placed at a proper place which is within the distance range of the flexible wire in accordance with the needs of the user. Meanwhile, when the user does not need to use the display panel temporarily or needs to put the display panel inside the groove 1, the entire flexible wire should be placed inside the spare space, so that the configuration of the spare space should meet a certain preparatory condition, such as being able to accommodate the flexible wire.

The integrated module 2 is connected to the main body of the inverter via a flexible wire, wherein, the wireless communication device is configured inside the display panel. The wireless communication device receives the information transmitted from the mobile control terminal via wireless transmission. In an embodiment of this invention, the mobile control terminal may be a mobile phone, a tablet or other portable hand-held mobile terminal devices. In an alternative embodiment of this invention, the mobile control terminal is a mobile phone, which communicates with the wireless communication device via Wifi. A developed APP is installed in the mobile phone, and corresponding upper machine software is installed in the wireless communication device. By virtue of the communication between APP and the upper machine software, it enables the user to control state of the inverter remotely. Besides, the mobile control terminal can also communicate with the wireless communication device via Bluetooth or 2.4G network, which increase the flexibility of the system. The mobile phone, served as the mobility control terminal, can be an iPhone or a phone with Android system. There are Apps which are developed on the basis of those two operating systems, and there is also corresponding upper machine software. By virtue of the wireless transmission, users can not only control the inverter by using the mobile control terminal, but also have the state information of the inverter displayed on the mobile control terminal, which largely facilitate the use of the inverter for the user.

The inverter device also comprises a test module. The wireless communication device receives the request information for 'test' from the mobile client, and calls the control unit to accomplish the test of the capacity, CCA (Cold Cranking Ampere, which commonly refers to the cranking ampere at −18□), the starting ability and the generator state of the converted battery; and returns the test result to the mobile control terminal. Users can control the battery in time in accordance to the acquired information, and it may avoid over discharging, which caused by further discharging even if the battery is out of electricity, and waste of electricity, which caused by switching-off when the battery is still with electricity.

The inverter device also comprises a draught fan controller. Users can use a mobile control terminal, such as a mobile phone, to control the rotate speed of a draught fan via wireless transmission to conquer the disadvantage that the conventional draught fan can only be at two states, i.e., 'off' and 'on'. When the draught fan is turned on in fall speed, the noise is always very big. By configuring the control function, it enables the draught fan to be in a state of variable speed, meanwhile it limits the noise of the draught fan, and enlarges the service life of the draught fan.

In conclusion, this invention enables the display panel to be separated from the main body of the inverter in a certain distance by introducing a flexible wire, which electrically connects the display penal and the main body; and a wireless communication device is configured inside the display panel. By virtue of receiving the control information from the mobile control terminal wirelessly, it enables users to control the on-off state of the inverter remotely. Meanwhile, users can place the display panel according to their own need, so that users can obtain the state information of the inverter in time. By configuring the test module, it enables users to send the test message from the mobile control terminal when necessary. Once the wireless communication device receives the test message, it accomplishes the test of the battery according to the corresponding message; then, the test result is returned to the mobile control terminal. Based on the test result, users can obtain the information of the electric quantity and the information if the battery is good or bad, and it helps to avoid the over discharging or waste of the battery, which enables users to control the electric quantity of the battery in maximum; besides, it can control the draught fan to be in a state of variable speed, which reduces the noise of the draught fan, and enlarges the service life of the draught fan.

It should be understood by the skilled in the art with the combination of the upper embodiments and the prior art that the variations can be achieved, not to go into details. Such variations do not influence the essence content of this invention, not to go into details.

The description listed above is detailed description of embodiments of the invention. It should be understood that the invention is not limited by the above embodiments. Any changes and modifications of the invention fall in the scope of the application for the skilled in the art. Therefore the changes and modifications made without departing from the spirit and scope of the invention fall in the scope of the invention.

What is claimed is:

1. An inverter device, comprising:
   a main body of the inverter; and
   a wireless communication device connected to the main body of the inverter via a flexible wire;
   wherein the wireless communication device and the main body of the inverter are independent devices, and the wireless communication device is configured to transmit to and receive messages from the main body of the inverter; and
   wherein the wireless, communication device further comprises a display panel configured to display state information of the main body of the inverter.

2. The device of claim 1, further comprising a test module configured to test at least one of a capacity, a starting current, and a starting ability of a power source to be converted.

3. The device of claim 1, further comprising:
   a draught fan configured to cool the inverter device; and
   a draught fan controller, which is connected to the draught fan and configured to control operations of the draught fan.

4. The device of claim 1, wherein the wireless communication device receives and transmits data signal via Bluetooth, Wifi, or 2.4G network.

5. The device of claim 4, wherein the wireless communication device is configured to transmit and receive data signals from a mobile control terminal, which communicates with the wireless communication device via Bluetooth, Wifi, or 2.4G network.

6. The device of claim 5, wherein the mobile control terminal comprises a mobile phone or a tablet computer.

7. The device of claim 4, wherein, the mobile control terminal is configured to control the main body of the inverter via the wireless communication device.

8. The device of claim 7, wherein the main body of the inverter is configured with a control unit, and the wireless communication device is configured to control the main body of the inverter via the control unit.

9. The device of claim 1, wherein the main body of the inverter is further configured with a groove, which is configured to receive the wireless communication device.

* * * * *